(12) United States Patent
An et al.

(10) Patent No.: US 11,143,079 B2
(45) Date of Patent: Oct. 12, 2021

(54) THERMOELECTRIC GENERATOR FOR VEHICLE

(71) Applicants: HYUNDAI MOTOR COMPANY, Seoul (KR); KIA MOTORS CORPORATION, Seoul (KR)

(72) Inventors: Ho Chan An, Hwaseong-si (KR); Byung Wook Kim, Seongnam-si (KR); Hoo Dam Lee, Seongnam-si (KR); Jin Woo Kwak, Suwon-si (KR); Kwang Min Choi, Seoul (KR); Jong Ho Seon, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 148 days.

(21) Appl. No.: 16/590,946

(22) Filed: Oct. 2, 2019

(65) Prior Publication Data
US 2020/0386140 A1 Dec. 10, 2020

(30) Foreign Application Priority Data
Jun. 7, 2019 (KR) .......................... 10-2019-0067490

(51) Int. Cl.
*F01N 3/02* (2006.01)
*F01N 5/02* (2006.01)
(Continued)

(52) U.S. Cl.
CPC ........... *F01N 5/025* (2013.01); *F01N 3/0205* (2013.01); *F01N 3/04* (2013.01); *F02M 26/24* (2016.02);
(Continued)

(58) Field of Classification Search
CPC .. F01N 3/0205; F01N 3/0234; F01N 2240/02; F01N 2240/36; F02M 26/24;
(Continued)

(56) References Cited

U.S. PATENT DOCUMENTS

| 2005/0211314 A1* | 9/2005 | Blomquist ............. F02M 26/70 |
| | | 137/625.41 |
| 2019/0323404 A1* | 10/2019 | Seon ........................ F28F 27/02 |
| 2020/0240304 A1* | 7/2020 | Quix ................... F02D 41/0055 |

FOREIGN PATENT DOCUMENTS

| DE | 102006019282 A1 * | 10/2007 | ............. F02M 26/13 |
| DE | 102012216756 A1 * | 3/2014 | ............. F02M 26/26 |

(Continued)

OTHER PUBLICATIONS

Machine translation of DE102006019282A1, accessed Apr. 24, 2021. (Year: 2021).*

(Continued)

*Primary Examiner* — Jonathan R Matthias
(74) *Attorney, Agent, or Firm* — Morgan, Lewis & Bockius LLP

(57) ABSTRACT

A thermoelectric generator for a vehicle utilizing heat of exhaust gas discharged from an engine of the vehicle includes a heat exchange unit, through which a coolant circulates, a thermoelectric generation unit for converting thermal energy of exhaust gas into electrical energy, a first flow passage for guiding the exhaust gas to pass through the heat exchange unit, a second flow passage for guiding the exhaust gas to pass through the thermoelectric generation unit, a third flow passage for guiding the exhaust gas to bypass the heat exchange unit and the thermoelectric generation unit without passing therethrough, a first valve for opening or closing the first flow passage, a second valve for selectively opening or closing the second flow passage and
(Continued)

the third flow passage, and a driving unit for operating the first valve and the second valve by a single power source.

11 Claims, 7 Drawing Sheets

(51) Int. Cl.
*F01N 3/04* (2006.01)
*F02M 26/25* (2016.01)
*F02M 26/24* (2016.01)
*F01N 13/00* (2010.01)

(52) U.S. Cl.
CPC ............ *F02M 26/25* (2016.02); *F01N 13/001* (2013.01); *F01N 2240/20* (2013.01)

(58) Field of Classification Search
CPC .. F02M 26/25; F02M 26/26; F02M 35/10255; F16K 1/2021; F16K 11/163; F16K 11/165; F16K 11/202
See application file for complete search history.

(56) References Cited

FOREIGN PATENT DOCUMENTS

| | | | |
|---|---|---|---|
| DE | 102016205752 A1 * | 10/2017 | ............. F02M 26/26 |
| DE | 102017119880 A1 * | 2/2019 | ............. F02M 26/33 |
| GB | 957997 A * | 5/1964 | ........... F16K 31/535 |
| KR | 10-2018-0077459 A | 7/2018 | |

OTHER PUBLICATIONS

Machine translation of DE102012216756A1, accessed Apr. 24, 2021. (Year: 2021).*

* cited by examiner

[FIG. 1]
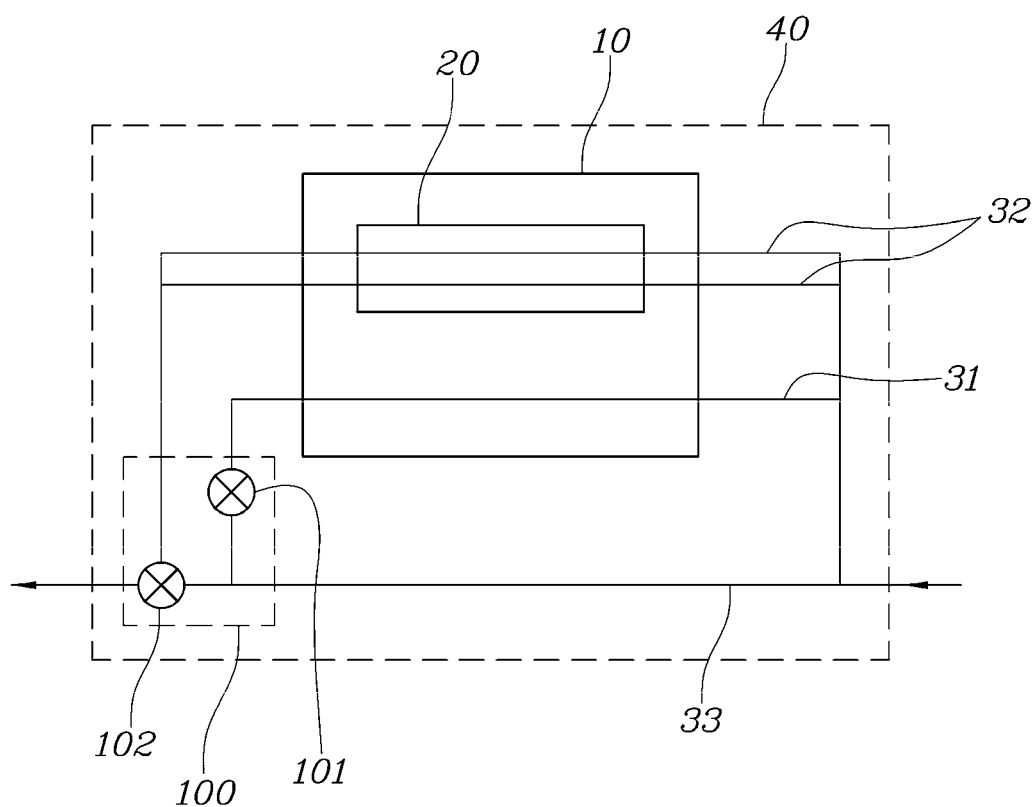

[FIG. 2]
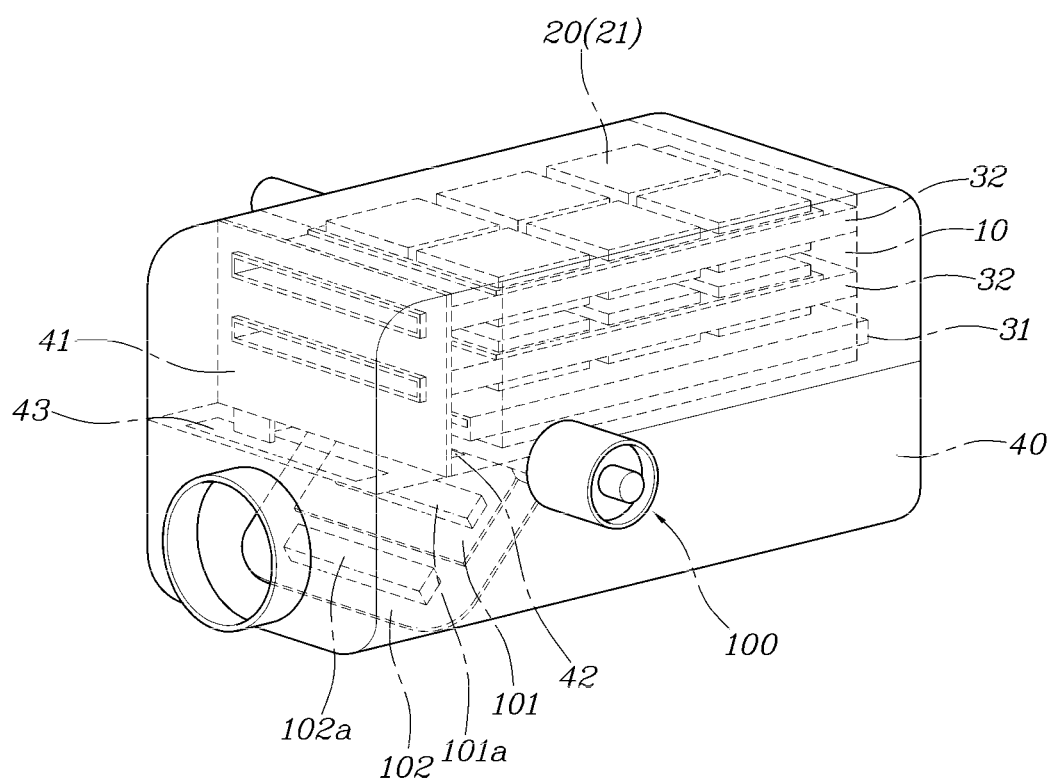

[FIG. 3]
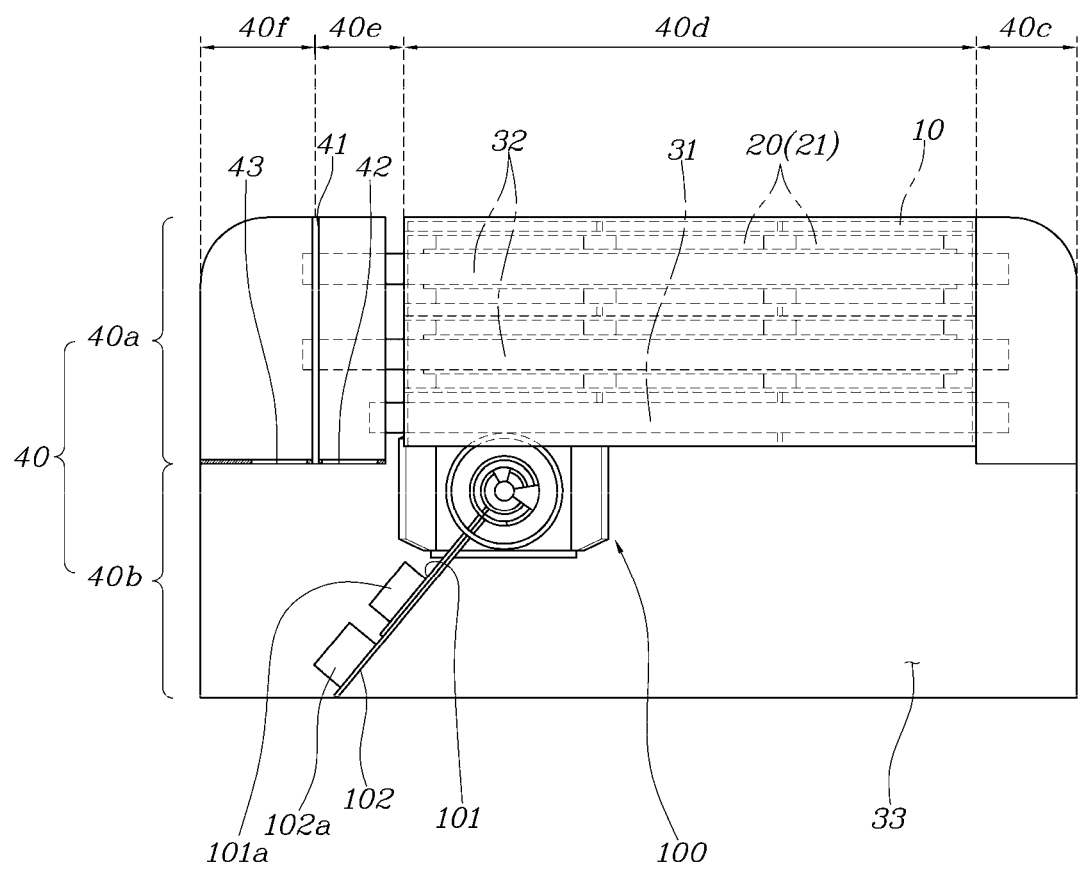

[FIG. 4]
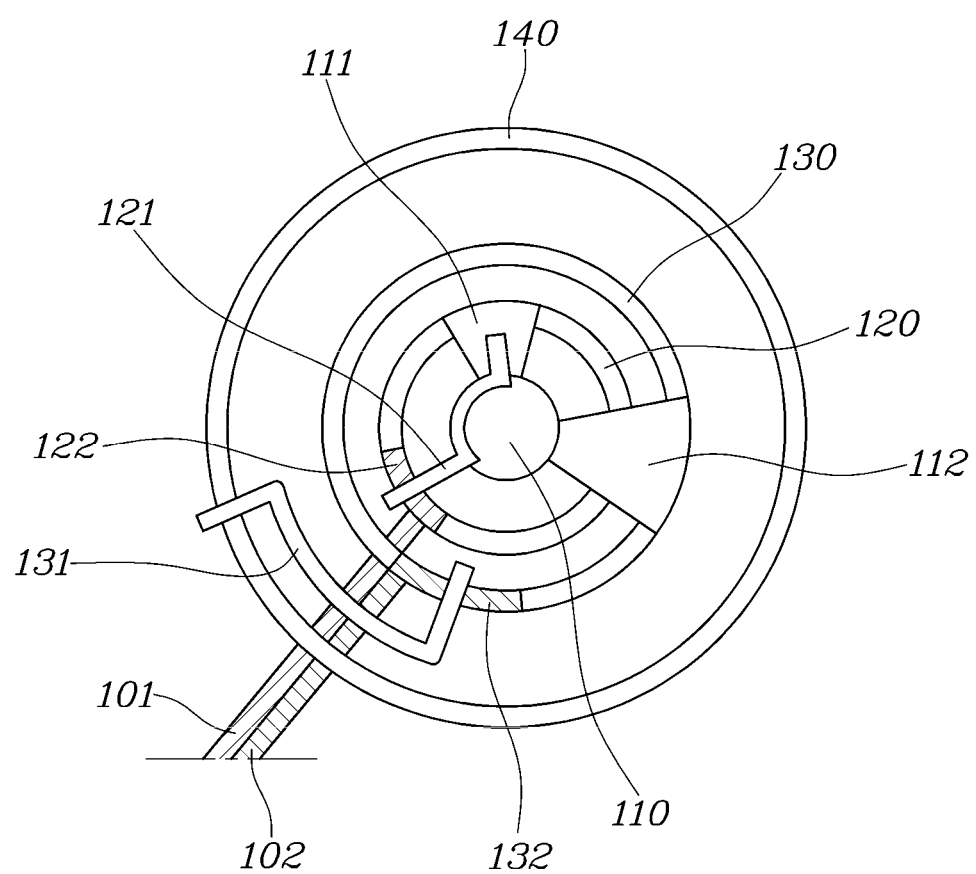

[FIG. 5]
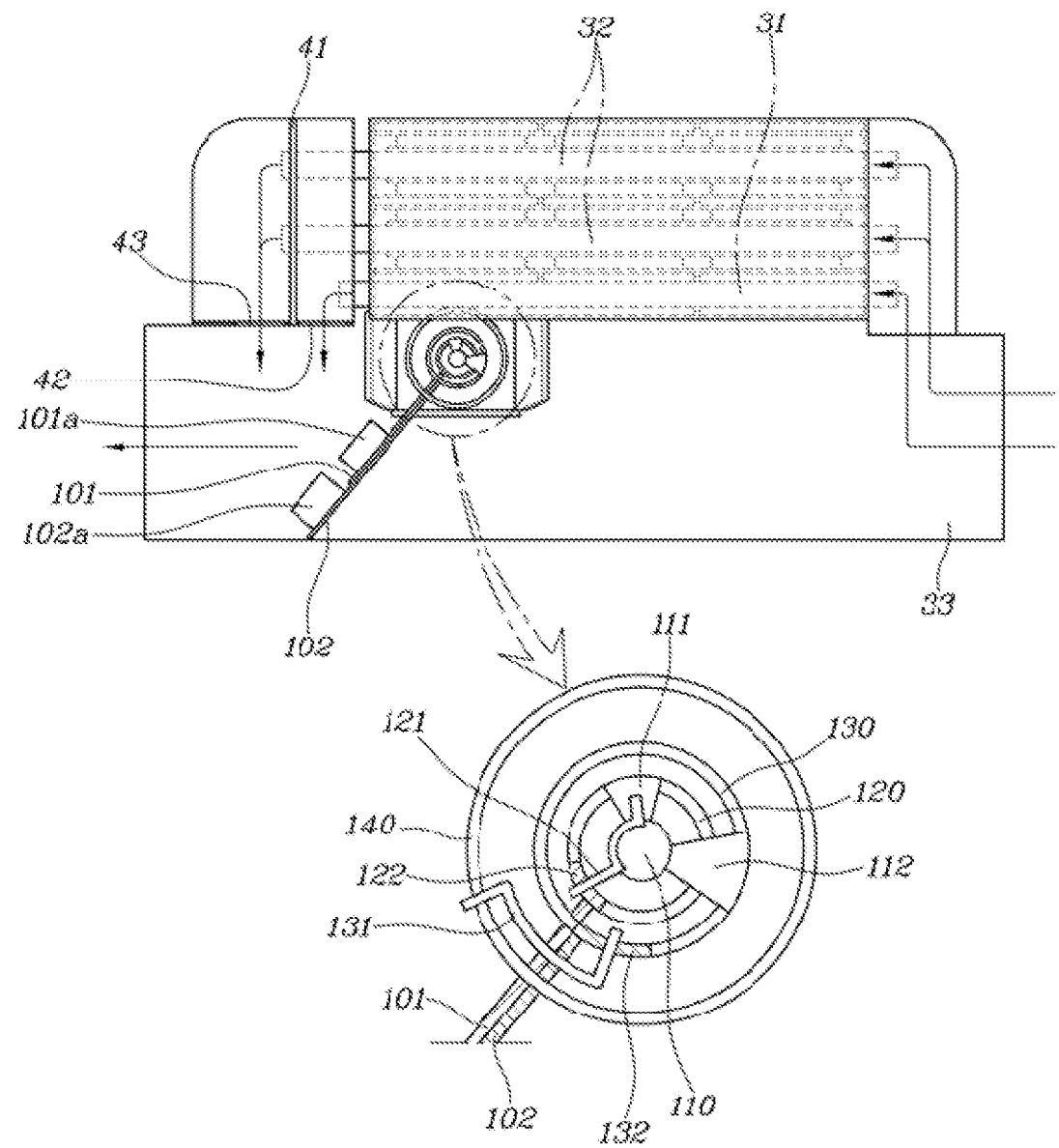

[FIG. 6]
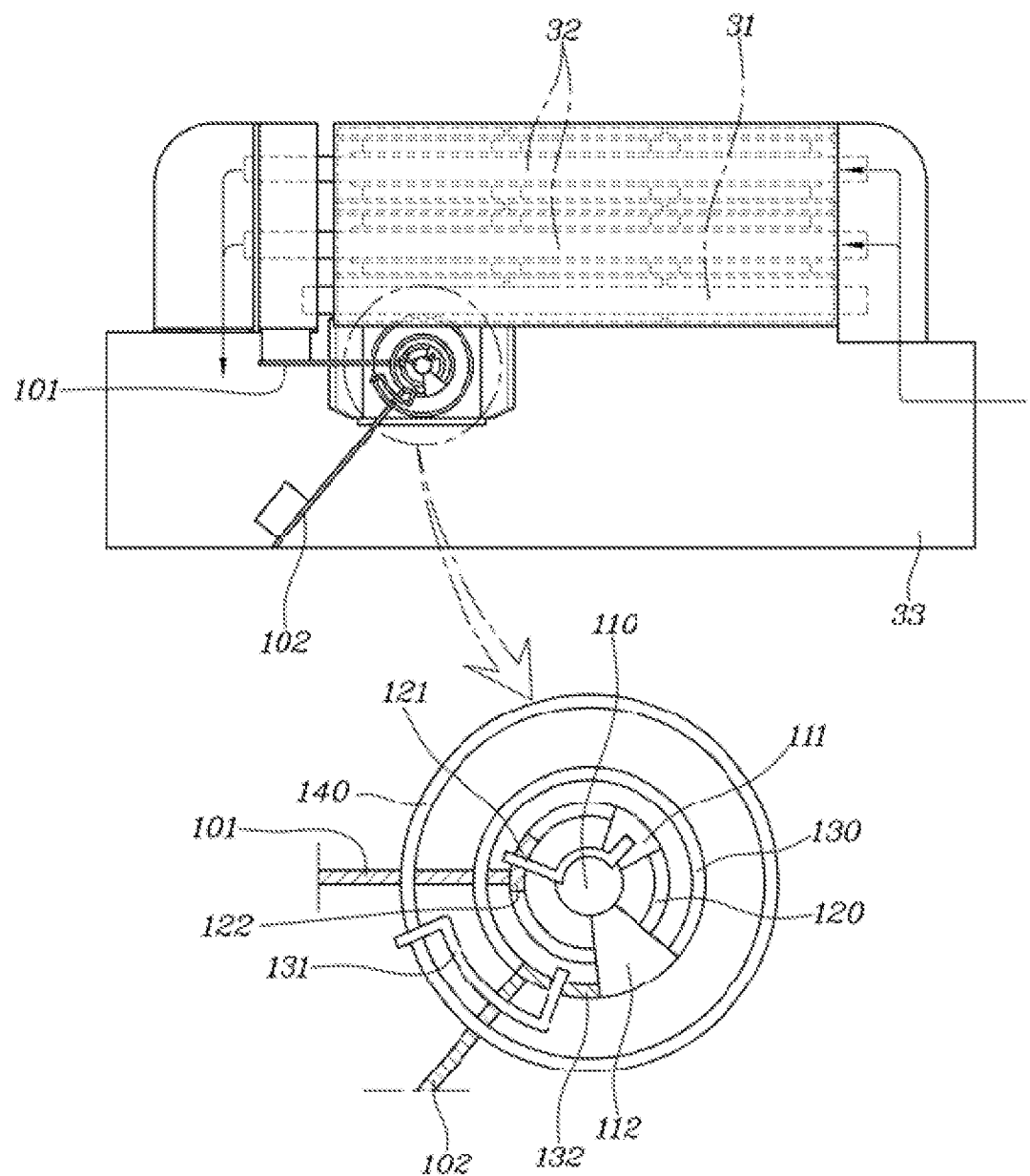

[FIG. 7]
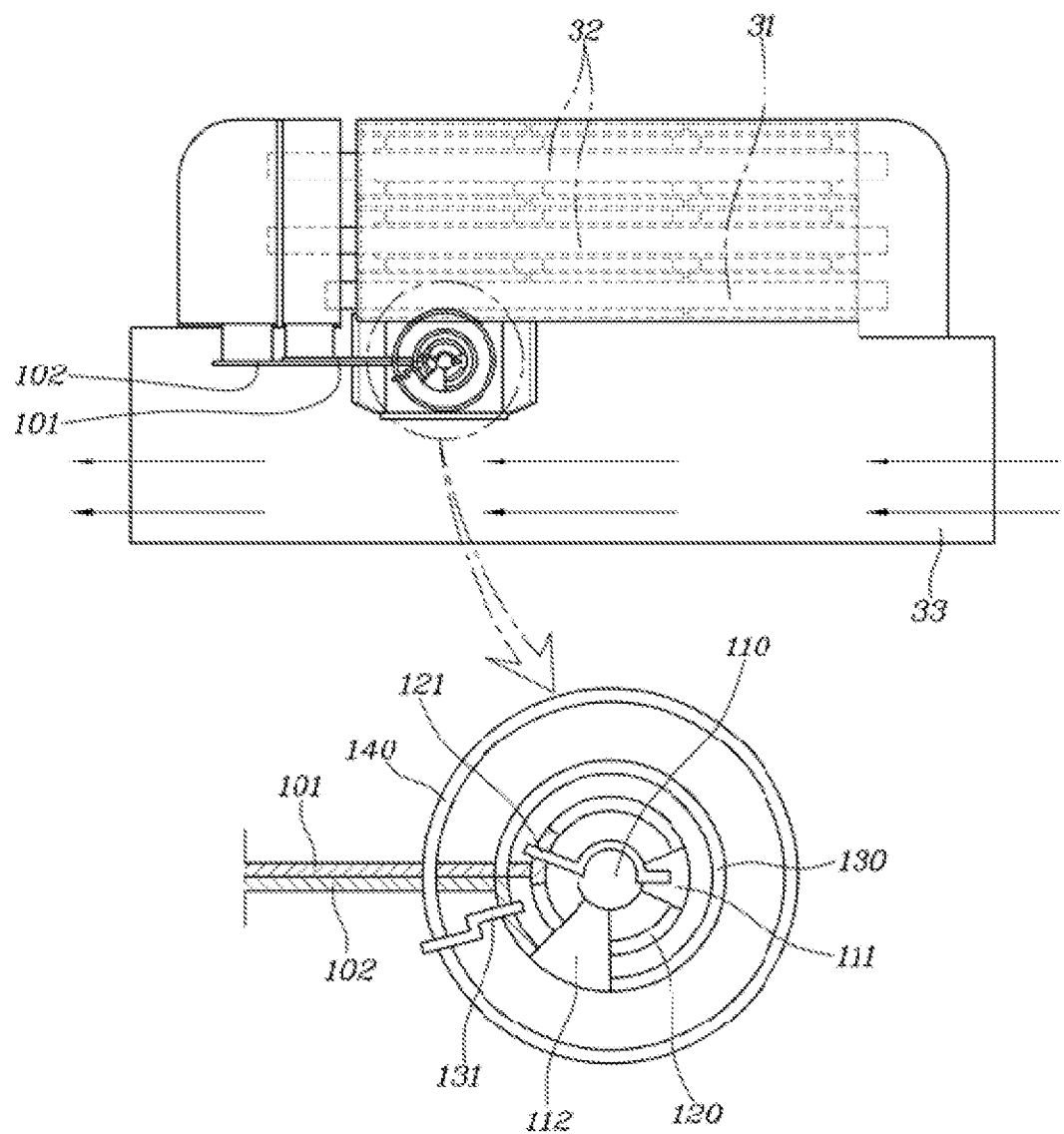

THERMOELECTRIC GENERATOR FOR VEHICLE

CROSS-REFERENCE TO RELATED APPLICATION

This application claims the benefit of priority to Korean Patent Application No. 10-2019-0067490, filed on Jun. 7, 2019 in the Korean Intellectual Property Office, the entire disclosure of which is incorporated herein by reference.

TECHNICAL FIELD

The present disclosure relates to a thermoelectric generator for a vehicle, and more particularly to a thermoelectric generator for a vehicle capable of improving fuel economy of the vehicle through change of a heat exchange mode for exhaust heat according to a driving mode of the vehicle.

BACKGROUND

Generally, an exhaust heat recovery system (EHRS) and a thermoelectric generation system (TEGS) are applied to vehicles, as technologies for utilizing exhaust heat.

The exhaust heat recovery system is a system for recovering exhaust heat through heat exchange between exhaust gas and a coolant, to utilize the recovered exhaust heat to warm up an engine during an initial stage of engine start in winter, thereby achieving an enhancement in fuel economy.

Such an exhaust heat recovery system has an effect of greatly utilizing exhaust heat during an initial state of engine start in winter, but has a problem in that exhaust gas is bypassed under other conditions and, as such, efficiency of the system may be degraded.

On the other hand, the thermoelectric generation system as mentioned above is a system in which a thermoelectric element for generating electricity using a temperature difference between a high temperature part and a low temperature part utilizes exhaust heat as the high temperature part while utilizing a coolant as the low temperature part, to generate electricity needed in a vehicle, thereby being capable of improving fuel economy of the vehicle.

The thermoelectric generation system exhibits wider utilization than the exhaust heat recovery system, but has a problem in that the quantity of generated electricity is limitative, as compared to an increase in costs caused by use of an expensive thermoelectric element.

In addition, in a general vehicle, a thermoelectric generation system and an exhaust heat recovery system are sequentially arranged in such a manner that exhaust gas is supplied to the exhaust heat recovery system after passing through the thermoelectric generation system. For this reason, there may be a drawback in that the effect of warming up a coolant may be degraded.

The above matters disclosed in this section are merely for enhancement of understanding of the general background of the invention and should not be taken as an acknowledgement or any form of suggestion that the matters form the related art already known to a person skilled in the art.

SUMMARY

Therefore, the present disclosure has been made in view of the above problems, and it is an object of the present disclosure to provide a thermoelectric generator for a vehicle capable of achieving an enhancement in fuel economy through change of a heat exchange mode for exhaust heat according to a driving mode of the vehicle.

In accordance with an aspect of the present disclosure, the above and other objects can be accomplished by providing a thermoelectric generator for a vehicle utilizing heat of exhaust gas discharged from an engine of the vehicle. The thermoelectric generator may include a heat exchange unit, through which a coolant to exchange heat with the exhaust gas circulates, a thermoelectric generation unit for converting thermal energy of the exhaust gas into electrical energy, a first flow passage for guiding the exhaust gas discharged from the engine to pass through the heat exchange unit, a second flow passage for guiding the exhaust gas discharged from the engine to pass through the thermoelectric generation unit, a third flow passage for guiding the exhaust gas discharged from the engine to bypass the heat exchange unit and the thermoelectric generation unit without passing through the heat exchange unit and the thermoelectric generation unit, a first valve for opening or closing the first flow passage, a second valve for selectively opening or closing the second flow passage and the third flow passage, and a driving unit for operating the first valve and the second valve by a single power source.

The thermoelectric generation unit may be disposed within the heat exchange unit. The thermoelectric generation unit may include a thermoelectric module having one side contacting the second flow passage and having another side being exposed to the coolant flowing within the heat exchange unit.

The thermoelectric generator may further include a case having the heat exchange unit and the thermoelectric generation unit disposed therein. The case may include a first zone having the first and second flow passages, the heat exchange unit and the thermoelectric generation unit disposed therein, and a second zone having the third flow passage and the first and second valves disposed therein.

The driving unit may include an actuating shaft to rotate in accordance with operation of a motor, a first guide shaft provided with a first link member to rotate in linkage with the actuating shaft such that the first guide shaft pivotally moves the first valve through rotation of the first link member, thereby opening or closing the first flow passage, a second guide shaft provided with a second link member to rotate in linkage with the actuating shaft such that the second guide shaft pivotally moves the second valve through rotation of the second link member, thereby selectively opening or closing the second flow passage and the third flow passage, and a housing having the actuating shaft, the first guide shaft and the second guide shaft disposed therein.

The first guide shaft may include a cylindrical shape, and have the actuating shaft disposed therein. The first link member may be disposed at an end of the first guide shaft such that the first link member rotates along a circumference of the first guide shaft. The second guide shaft may include a cylindrical shape, and have the first guide shaft disposed therein. The second link member may be disposed at an end of the second guide shaft such that the second link member rotates along a circumference of the second guide shaft.

The actuating shaft, the first guide shaft and the second guide shaft may have central axes, respectively, aligned with one another.

The driving unit may include a first elastic member arranged between the actuating shaft and the first link member, to limit normal rotation and reverse rotation of the first link member, and a second elastic member arranged between the second link member and the housing, to limit normal rotation and reverse rotation of the second link member.

A first engagement member may be attached to the actuating shaft such that the first engagement member can contact the first link member, to normally rotate the first link member. A second engagement member may be attached to the actuating shaft such that the second engagement member can contact the second link member, to normally rotate the second link member.

The thermoelectric generator may further include a controller for controlling whether or not the motor rotates and a rotation angle of the motor. The controller may control whether or not the motor rotates and the rotation angle of the motor in accordance with a warm-up mode, a thermoelectric generation mode and a bypass mode.

In the warm-up mode, the controller may control the motor to be disposed at a normal position such that the second valve is disposed at a position where the second valve closes the third flow passage while opening the second flow passage, thereby causing the exhaust gas to flow through the first flow passage and the second flow passage. In the thermoelectric generation mode, the controller may normally rotate the motor by a predetermined angle such that the first valve moves to a position where the first valve closes the first flow passage, and the second valve is maintained at a position where the second valve closes the third flow passage while opening the second flow passage, thereby causing the exhaust gas to flow only through the second flow passage. In the bypass mode, the controller may further normally rotate the motor by a predetermined angle such that the first valve is maintained at the position where the first valve closes the first flow passage, and the second valve moves to a position where the second valve closes the second flow passage while opening the third flow passage, thereby causing the exhaust gas to flow only through the third flow passage.

The first flow passage, the second flow passage and the third flow passage may be connected in parallel.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 is a diagram illustrating a configuration of a thermoelectric generator for a vehicle according to an exemplary embodiment of the present disclosure;

FIG. 2 is a perspective view illustrating the thermoelectric generator according to an exemplary embodiment of the present disclosure;

FIG. 3 is a side view illustrating the thermoelectric generator according to an exemplary embodiment of the present disclosure;

FIG. 4 is a side view illustrating a configuration of a driving unit according to an exemplary embodiment of the present disclosure; and FIGS. 5 to 7 are views illustrating operation states of the thermoelectric generator according to an exemplary embodiment of the present disclosure.

DETAILED DESCRIPTION

Reference will now be made in detail to exemplary embodiments, examples of which are illustrated in the accompanying drawings. However, the present disclosure may be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. The present disclosure is defined only by the categories of the claims. Wherever possible, the same reference numbers will be used throughout the drawings to refer to the same or like parts.

FIG. 1 is a diagram illustrating a configuration of a thermoelectric generator for a vehicle according to an exemplary embodiment of the present disclosure. FIG. 2 is a perspective view illustrating the thermoelectric generator according to an exemplary embodiment of the present disclosure. FIG. 3 is a side view illustrating the thermoelectric generator according to an exemplary embodiment of the present disclosure. FIG. 4 is a side view illustrating a configuration of a driving unit according to an exemplary embodiment of the present disclosure.

As illustrated in the drawings, the thermoelectric generator according to an exemplary embodiment of the present disclosure is a thermoelectric generation system utilizing heat of exhaust gas discharged from an engine of a vehicle. The thermoelectric generator has a heat exchange structure capable of achieving integrated operation of a mode for recovering heat of exhaust gas by a coolant and a mode for converting thermal energy of exhaust gas into electrical energy.

For example, the thermoelectric generator for vehicles according to an exemplary embodiment of the present disclosure includes a heat exchange unit 10, through which a coolant to exchange heat with exhaust gas circulates, a thermoelectric generation unit 20 for converting thermal energy of exhaust gas into electrical energy, a first flow passage 31 for guiding exhaust gas discharged from an engine to pass through the heat exchange unit 10, a second flow passage 32 for guiding the exhaust gas discharged from the engine to pass through the thermoelectric generation unit 20, and a third flow passage 33 for guiding the exhaust gas discharged from the engine to bypass the heat exchange unit 10 and the thermoelectric generation unit 20 without passing through the heat exchange unit 10 and the thermoelectric generation unit 20. The thermoelectric generator further includes a first valve for opening or closing the first flow passage 31, a second valve 102 for selectively opening or closing the second flow passage 32 and the third flow passage 33, and a driving unit 100 for operating the first valve 101 and the second valve 102 by a single power source.

The heat exchange unit 10 is a means for recovering heat of exhaust gas by a coolant. In connection with this, the heat exchange unit 10 is configured to enable the coolant to flow around the first flow passage 31, through which exhaust gas discharged from the engine flows, in such a manner that the coolant is in contact with the first flow passage 31. For example, the heat exchange unit 10 may be embodied to take the shape of a box, through which the first flow passage 31 extends. Of course, the heat exchange unit 10 is not limited to the box shape, and may be embodied as various shapes capable of allowing the coolant to flow around the first flow passage 31 such that heat exchange between the exhaust gas and the coolant is achieved. For example, the heat exchange unit 10 may be embodied to take the shape of a water jacket surrounding the first flow passage 31.

The thermoelectric generation unit 20 is a means for converting thermal energy of exhaust gas into electrical energy. The thermoelectric generation unit 20 is disposed within the heat exchange unit 10. Accordingly, the coolant flowing within the heat exchange unit 10 is also in contact with the thermoelectric generation unit 20 and, as such, may exchange heat with the thermoelectric generation unit 20.

The thermoelectric generation unit 20 includes a thermoelectric module having one side contacting the second flow passage 32 and another side being exposed to the coolant flowing within the heat exchange unit 10. In this case, the thermoelectric module 21 is constituted by plural thermoelectric elements electrically connected to one another. Each thermoelectric element functions to generate electricity by utilizing a temperature difference between a high temperature part thereof and a low temperature part thereof. In the illustrated embodiment, the thermoelectric module 21 is disposed such that the high temperature part of each thermoelectric element contacts the second flow passage 32, and the low temperature part of each thermoelectric element is exposed to the coolant.

Further, the heat exchange unit 10 and the thermoelectric generation unit 20 are disposed within a case 40 in which a receiving space is defined.

In this case, the case 40 is divided into a first zone 40*a*, through which the first flow passage 31 and the second flow passage 32 extend and in which the heat exchange unit 10 and the thermoelectric generation unit 20 are disposed, and a second zone 40*b*, in which the third flow passage 33 is formed, and the first valve 101 and the second valve 102 are installed. For example, the first zone 40*a* and the second zone 40*b* may be defined by vertically dividing the interior of the case 40 into two portions.

The first zone 40*a* is divided into a 1-1-th zone 40*c*, in which inlets of the first and second flow passages 31 and 32 are disposed, a 1-2-th zone 40*d*, in which the heat exchange unit 10 and the thermoelectric generation unit 20 are disposed, a 1-3-th zone 40*e*, in which an outlet of the first flow passage 31 is disposed, and a 1-4-th zone 40*f*, in which an outlet of the second flow passage 32 is disposed. For example, the 1-1-th zone 40*c*, the 1-2-th zone 40*d*, the 1-3-th zone 40*e*, and the 1-4-th zone 40*f* may be defined by dividing the first zone 40*a* into four portions with reference to a flow direction of exhaust gas.

In this case, the 1-1-th zone 40*c*, the 1-2-th zone 40*d*, the 1-3-th zone 40*e*, and the 1-4-th zone 40*f* may be formed as separate spaces, respectively, or may be formed by dividing a single space into plural spaces, respectively. In the illustrated embodiment, the 1-1-th zone 40*c* and the 1-2-th zone 40*d* are formed as separate spaces, respectively, whereas the 1-3-th zone 40*e* and the 1-4-th zone 40*f* are formed by dividing a single space into two portions by a partition, respectively.

Further, the 1-1-th zone 40*c*, the 1-3-th zone 40*e*, and the 1-4-th zone 40*f* are formed to communicate with the second zone 40*b* within the case 40. Accordingly, the inlets of the first and second flow passages 31 and 32 are secured through the 1-1-th zone 40*c*, the outlet of the first flow passage 31 is secured through the 1-3-th zone 40*e*, and the outlet of the second flow passage 32 is secured through the 1-4-th zone 40*f*.

In this case, the 1-1-th zone 40*c* and the second zone 40*b* are formed to communicate with each other through all portions of an interface therebetween and, as such, smooth flow of exhaust gas may be achieved between the 1-1-th zone 40*c* and the second zone 40*b*. However, it is preferred that the interface between the 1-3-th zone 40*e* and the second zone 40*b* and the interface between the 1-4-th zone 40*f* and the second zone 40*b* have communication spaces at desired portions thereof, respectively, in order to easily open or close the zones by the first and second valves 101 and 102. For example, a first through hole 42 is formed at the interface between the 1-3-th zone 40*e* and the second zone 40*b*, and a second through hole 43 is formed at the interface between the 1-4-th zone 40*f* and the second zone 40*b*. In this case, the first through hole 42 and the second through hole 43 may include a substantially quadrangular cross-section.

Further, the first flow passage 31, the second flow passage 32 and the third flow passage 33 form spaces, through which exhaust gas flows. Each of the first and second flow passages 31 and 32 is constituted by a pipe having a rectangular cross-section while being formed with an inlet and an outlet. In connection with this, the first flow passage 31 and the second flow passage 32 are disposed in the first zone 40*a* of the case 40 such that the first flow passage 31 extends through the heat exchange unit 10, and the second flow passage 32 extends through the thermoelectric generation unit 20. On the other hand, the third flow passage 33 is formed by applying the second zone 40*b* of the case 40 without any modification. In this case, the first flow passage 31, the second flow passage 32 and the third flow passage 33 are connected in parallel.

In addition, the first valve 101 is disposed in the second zone 40*b* of the case 40, to open or close the first through hole 42, for opening or closing of the first flow passage 31. The second valve 102 is also disposed in the second zone 40*b* of the case, to selectively open or close the second flow passage 32 and the third flow passage 33. In addition, the driving unit 100, which operates the first valve 101 and the second valve 102 by a single power source, is disposed in the second zone 40*b* of the case 40. In this case, the first valve 101 and the second valve 102 pivotally move in accordance with operation of the driving unit 100, thereby opening or closing the first through hole 42 and the second through hole 43, respectively. To this end, each of the first and second valves 101 and 102 has the shape of a plate pivotally movable by the driving unit 100. The second valve 102 has a shape corresponding to the cross-section of the third flow passage 33 and, as such, the cross-section of the third flow passage 33 may be closed by the second valve 102. Furthermore, a first protrusion 101*a* corresponding to the first through hole 42 in terms of position and shape is formed at the first valve 101, and a second protrusion 102*a* corresponding to the second through hole 43 in terms of position and shape is formed at the second valve 102. Accordingly, the first protrusion 101*a* and the second protrusion 10-2*a* open or close the first through hole 42 and the second through hole 43 through pivotal movement of the first valve 101 and the second valve 102, respectively.

The driving unit 100 is a means for operating the first valve 101 and the second valve 102 by a single power source. The driving unit 100 includes an actuating shaft 110 rotating in accordance with operation of a motor (not shown), a first guide shaft 120 provided with a first link member 122 to rotate in linkage with the actuating shaft 110 such that the first guide shaft 120 pivotally moves the first valve 101 through rotation of the first link member 122, thereby opening or closing the first flow passage 31, a second guide shaft 130 provided with a second link member 132 to rotate in linkage with the actuating shaft 110 such that the second guide shaft 130 pivotally moves the second valve 102 through rotation of the second link member 132, thereby selectively opening or closing the second flow passage 32 and the third flow passage 33, and a housing 140 for receiving the actuating shaft 110, the first guide shaft 120 and the second guide shaft 130 therein.

In this case, it is preferred that the actuating shaft 110, the first guide shaft 120 and the second guide shaft 130 have central axes aligned with one another, respectively.

To this end, the first guide shaft 120 includes a cylindrical shape, and has the actuating shaft 110 disposed therein. Similarly, the second guide shaft 130 includes a cylindrical shape, and has the first guide shaft 120 disposed therein.

The first link member 122 is disposed at an end of the first guide shaft 120 such that the first link member 122 rotates along a circumference of the first guide shaft 120. The second link member 132 is disposed at an end of the second guide shaft 130 such that the second link member 132 rotates along a circumference of the second guide shaft 130. Various structures may be implemented in order to connect the first link member 122 and the second link member 132 to the first guide shaft 120 and the second guide shaft 130, respectively, for rotation thereof. In the illustrated embodiment, a guide means such as a rail or a groove is provided at the end of the first guide shaft 120 in order to allow the first link member 122 to rotate along the circumference of the first guide shaft 120 and, as such, the first link member 122 may rotate along the guide means. Similarly, a guide means such as a rail or a groove is provided at the end of the second guide shaft 130 in order to allow the second link member 132 to rotate along the circumference of the second guide shaft 130 and, as such, the second link member 132 may rotate along the guide means.

Further, a first engagement member 111 is attached to the actuating shaft 110 such that the first engagement member 111 can contact the first link member 122, to normally rotate the first link member 122. A second engagement member 112 is also attached to the actuating shaft 110 such that the second engagement member 112 can contact the second link member 132, to normally rotate the second link member 132. Accordingly, the first engagement member 111 and the second engagement member 112 rotate in accordance with driving of the actuating shaft 110, thereby rotating the first link member 122 and the second link member 132, respectively. Of course, the first engagement member 111 and the second engagement member 112 are spaced apart from each other by a predetermined angle, and the first link member 122 and the second link member 132 are also spaced apart from each other by a predetermined angle. In accordance with the above-described arrangement, the first engagement member 111 first rotates the first link member 122 as the actuating shaft 110 rotates. As rotation of the actuating shaft 110 is continued, the second engagement member 112 then rotates the second link member 132.

In order to provide return force to return the first link member 122 and the second link member 132 to original positions thereof after rotation thereof, the driving unit 100 further includes a first elastic member 121 installed between the actuating shaft 110 and the first link member 122, to limit normal rotation and reverse rotation of the first link member 122, and a second elastic member 131 installed between the second link member 122 and the housing 140, to limit normal rotation and reverse rotation of the second link member 132.

In this case, the first elastic member 121 provides return force while being tensioned in accordance with normal rotation of the first link member 122, and the second elastic member 131 provides return force while being compressed in accordance with normal rotation of the second link member 132. For such functions, the first elastic member 121 and the second elastic member 131 may be implemented using various spring structures.

The thermoelectric generator according to the illustrated embodiment of the present disclosure further includes a controller (not shown) for controlling whether or not the motor rotates and a rotation angle of the motor. The controller controls whether or not the motor rotates and the rotation angle of the motor in accordance with an operation mode, that is, a warm-up mode, a thermoelectric generation mode, or a bypass mode.

For example, in the warm-up mode, the controller controls the motor to be disposed at a normal position. In this state, the second valve 102 is disposed at a position where the second valve 102 closes the third flow passage 33 while opening the second flow passage 32. Accordingly, exhaust gas flows through the first flow passage 31 and the second flow passage 32.

On the other hand, in the thermoelectric generation mode, the controller normally rotates the motor by a predetermined angle such that the first valve 101 moves to a position where the first valve 101 closes the first flow passage 31, and the second valve 102 is maintained at a position where the second valve 102 closes the third flow passage 33 while opening the second flow passage 32. Accordingly, exhaust gas flows only through the second flow passage 32.

In addition, in the bypass mode, the controller further normally rotates the motor by a predetermined angle such that the first valve 101 is maintained at the position where the first valve 101 closes the first flow passage 31, and the second valve 102 moves to a position where the second valve 102 closes the second flow passage 32 while opening the third flow passage 33. According, exhaust gas flows only through the third flow passage 33. In accordance with an exemplary embodiment of the present disclosure, the controller may be embodied through a non-volatile memory (not shown) configured to store an algorithm configured to control operation of various constituent elements of the vehicle or data as to software commands for execution of the algorithm, and a processor (not shown) configured to execute operation as will be described hereinafter, using the data stored in the memory. Here, the memory and the processor may be embodied as individual chips, respectively. Alternatively, the memory and the processor may be embodied as a single unified chip. The processor may take the form of one or more processors.

Hereinafter, operation states of the thermoelectric generator for vehicles configured in accordance with an exemplary embodiment of the present disclosure will be described with reference to the accompanying drawings.

FIGS. 5 to 7 are views illustrating operation states of the thermoelectric generator according to an exemplary embodiment of the present disclosure. In particular, FIG. 5 is a view illustrating an operation state in the warm-up mode, FIG. 6 is a view illustrating an operation state in the thermoelectric generation mode, and FIG. 7 is a view illustrating an operation state in the bypass mode.

First, in the warm-up mode corresponding to an initial driving stage of the vehicle, the motor is in a non-operation state (rotation angle of the motor: 0°), as illustrated in FIG. 5. In this state, both the first valve 101 and the second valve 102 are disposed at original positions thereof (valve rotation angle: 0°), respectively. Accordingly, both the first elastic member 121 and the second elastic member 131 are maintained in a state in which neither tension force nor compression force is applied.

In this state, the first valve 101 is disposed at a position where the first valve 101 opens the first flow passage 31, and the second valve 102 is disposed at a position where the second valve 102 opens the second flow passage 32 while, in particular, closing the third flow passage 33.

Accordingly, exhaust gas warms up a coolant while flowing through the first flow passage 31 and the second flow passage 32. In this state, the thermoelectric generation unit 20 also performs generation of electricity.

When warm-up of the coolant is no longer required as driving of the vehicle is continued for a certain period of time, the operation mode of the thermoelectric generator is switched to the thermoelectric generation mode. In this state, the motor rotates normally by a predetermined angle (motor rotation angle: 50°), as illustrated in FIG. 6. Accordingly, the actuating shaft 110 rotates 50°, thereby rotating the first engagement member 111 and the second engagement member 112 through an angle of 50°. As a result, the first link member 122 connected to the first engagement member 111 via the first elastic member 121 rotates 50°. Accordingly, the first valve 101 rotates in accordance with rotation of the first link member 122, thereby closing the first through hole 42. As such, the first flow passage 31 is closed. In this state, no tension force is applied to the first elastic member 121 because the first link member 122 moves while rotating through the same rotation angle as the first elastic member 121 when the first elastic member 121 moves while rotating.

Of course, the second engagement member 112 rotates 50° and, as such, moves only to a position near the second link member 132. Accordingly, the second valve 102, the second link member 132 and the second elastic member 131 are maintained in the warm-up mode states thereof, respectively.

Accordingly, exhaust gas flows only through the second flow passage 32 and, as such, most thermal energy of the exhaust gas is converted into electrical energy in the thermoelectric generation unit 20.

When the operation mode of the thermoelectric generator is switched to the bypass mode for bypassing exhaust gas in accordance with driving conditions of the vehicle, the motor further rotates normally through a predetermined angle (motor rotation angle: 100°), as illustrated in FIG. 7. Accordingly, the actuating shaft 110 further rotates 50°, as compared to the thermoelectric generation mode. As such, the actuating shaft 110 further rotates the first engagement member 111 and the second engagement member 112 through an angle of 50°. In spite of further rotation of the first engagement member 111 as described above, the first link member 122 cannot further rotate because the first valve 101 connected to the first link member 122 has already closed the first through hole 42. As a result, the first elastic member 121 absorbs rotation force of the actuating shaft 110 while being tensioned. Of course, the second engagement member 112 rotates the second link member 132 through an angle of 50° while contacting the second link member 132. As a result, the second valve 102 rotates in accordance with rotation of the second link member 132, to close the second through hole 43, and, as such, the second flow passage 32 is closed, and the third flow passage 33 is opened. In this state, the second elastic member 131 is compressed, corresponding to the rotation angle of the second link member 132.

Accordingly, exhaust gas bypasses the heat exchange unit 10 and the thermoelectric generation unit 20 while flowing only through the third flow passage 33.

Meanwhile, when the actuating shaft 110 returns to an original position thereof as driving of the vehicle is stopped, the first link member 122 and the second link member 131 return to original positions thereof by virtue of tension force accumulated in the first elastic member 121 and compression force accumulated in the second elastic member 131, respectively, and, as such, the first valve 101 and the second valve 102 return to the warm-up mode states thereof, respectively.

As apparent from the above description, in accordance with various exemplary embodiments of the present disclosure, an effect of enhancing fuel economy may be expected by changing a heat exchange mode associated with exhaust heat in such a manner that recovery of exhaust heat and thermoelectric generation are selectively applied in accordance with a driving mode of the vehicle.

In addition, in accordance with an exemplary embodiment of the present disclosure, the first flow passage extending through the heat exchange unit and the second flow passage extending through the thermoelectric generation unit are arranged in parallel such that exhaust gas may directly pass through the first flow passage in a warm-up mode, thereby more rapidly warming up a coolant, as compared to a conventional case in which a thermoelectric generation system and an exhaust heat recovery system are sequentially arranged such that exhaust gas is supplied to the exhaust heat recovery system after passing through the thermoelectric generation system, thereby resulting in degradation in coolant warm-up effect. Furthermore, the second flow passage contacting the coolant may be opened and, as such, the coolant warm-up time may be further reduced.

Furthermore, operation of the first and second valves to implement a warm-up mode, a thermoelectric generation mode and a bypass mode through selective opening or closing of the first to third flow passages may be controlled using a single motor and, as such, an effect of reducing manufacturing costs of the device may be expected.

Although the preferred exemplary embodiments of the present disclosure have been disclosed for illustrative purposes, those skilled in the art will appreciate that various modifications, additions and substitutions are possible, without departing from the scope and spirit of the invention as disclosed in the accompanying claims.

What is claimed is:

1. A thermoelectric generator for a vehicle utilizing heat of exhaust gas discharged from an engine of the vehicle, comprising:
    a heat exchange unit, through which a coolant to exchange heat with the exhaust gas circulates;
    a thermoelectric generation unit for converting thermal energy of the exhaust gas into electrical energy;
    a first flow passage for guiding the exhaust gas discharged from the engine to pass through the heat exchange unit;
    a second flow passage for guiding the exhaust gas discharged from the engine to pass through the thermoelectric generation unit;
    a third flow passage for guiding the exhaust gas discharged from the engine to bypass the heat exchange unit and the thermoelectric generation unit without passing through the heat exchange unit and the thermoelectric generation unit;
    a first valve for opening or closing the first flow passage;
    a second valve for selectively opening or closing one of the second flow passage and the third flow passage; and
    a driving unit for operating the first valve and the second valve by a single power source.

2. The thermoelectric generator according to claim 1, wherein:
    the thermoelectric generation unit is disposed within the heat exchange unit; and
    the thermoelectric generation unit comprises a thermoelectric module having one side contacting the second flow passage and having another side being exposed to the coolant flowing within the heat exchange unit.

3. The thermoelectric generator according to claim 1, further comprising:
a case having the heat exchange unit and the thermoelectric generation unit disposed therein,
wherein the case includes:
a first zone having the first and second flow passages, the heat exchange unit and the thermoelectric generation unit disposed therein, and
a second zone having the third flow passage and the first and second valves disposed therein.

4. The thermoelectric generator according to claim 1, wherein the driving unit comprises:
an actuating shaft to rotate in accordance with operation of a motor;
a first guide shaft provided with a first link member to rotate in linkage with the actuating shaft such that the first guide shaft pivotally moves the first valve through rotation of the first link member, thereby opening or closing the first flow passage;
a second guide shaft provided with a second link member to rotate in linkage with the actuating shaft such that the second guide shaft pivotally moves the second valve through rotation of the second link member, thereby selectively opening or closing the second flow passage and the third flow passage; and
a housing having the actuating shaft, the first guide shaft and the second guide shaft disposed therein.

5. The thermoelectric generator according to claim 4, wherein:
the first guide shaft includes a cylindrical shape, and has the actuating shaft disposed therein;
the first link member is disposed at an end of the first guide shaft such that the first link member rotates along a circumference of the first guide shaft;
the second guide shaft includes a cylindrical shape, and has the first guide shaft disposed therein; and
the second link member is disposed at an end of the second guide shaft such that the second link member rotates along a circumference of the second guide shaft.

6. The thermoelectric generator according to claim 5, wherein the actuating shaft, the first guide shaft and the second guide shaft have central axes, respectively, aligned with one another.

7. The thermoelectric generator according to claim 4, wherein the driving unit comprises:
a first elastic member arranged between the actuating shaft and the first link member, to limit normal rotation and reverse rotation of the first link member; and
a second elastic member arranged between the second link member and the housing, to limit normal rotation and reverse rotation of the second link member.

8. The thermoelectric generator according to claim 7, wherein:
a first engagement member is attached to the actuating shaft such that the first engagement member can contact the first link member, to normally rotate the first link member, and
a second engagement member is attached to the actuating shaft such that the second engagement member can contact the second link member, to normally rotate the second link member.

9. The thermoelectric generator according to claim 4, further comprising:
a controller for controlling whether or not the motor rotates and a rotation angle of the motor,
wherein the controller controls whether or not the motor rotates and the rotation angle of the motor in accordance with a warm-up mode, a thermoelectric generation mode and a bypass mode.

10. The thermoelectric generator according to claim 9, wherein:
in the warm-up mode, the controller controls the motor to be disposed at a normal position such that the second valve is disposed at a position where the second valve closes the third flow passage while opening the second flow passage, thereby causing the exhaust gas to flow through the first flow passage and the second flow passage;
in the thermoelectric generation mode, the controller normally rotates the motor by a predetermined angle such that the first valve moves to a position where the first valve closes the first flow passage, and the second valve is maintained at a position where the second valve closes the third flow passage while opening the second flow passage, thereby causing the exhaust gas to flow only through the second flow passage; and
in the bypass mode, the controller further normally rotates the motor by a predetermined angle such that the first valve is maintained at the position where the first valve closes the first flow passage, and the second valve moves to a position where the second valve closes the second flow passage while opening the third flow passage, thereby causing the exhaust gas to flow only through the third flow passage.

11. The thermoelectric generator according to claim 1, wherein the first flow passage, the second flow passage and the third flow passage are connected in parallel.

* * * * *